United States Patent
Kim et al.

(10) Patent No.: US 8,130,041 B2
(45) Date of Patent: Mar. 6, 2012

(54) POWER AMPLIFIER DEVICE

(75) Inventors: Seong-Il Kim, Daejeon (KR); Jongmin Lee, Daejeon (KR); Byoung-Gue Min, Daejeon (KR); Hyung Sup Yoon, Daejeon (KR); Hae Cheon Kim, Daejeon (KR); Eun Soo Nam, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 12/960,153

(22) Filed: Dec. 3, 2010

(65) Prior Publication Data

US 2011/0133843 A1 Jun. 9, 2011

(30) Foreign Application Priority Data

Dec. 4, 2009 (KR) .................. 10-2009-0120101

(51) Int. Cl.
*H03F 3/68* (2006.01)
(52) U.S. Cl. ............... 330/295; 330/207 P; 330/124 R
(58) Field of Classification Search .............. 330/295, 330/207 P, 124 R
See application file for complete search history.

(56) References Cited

U.S. PATENT DOCUMENTS

| | | | | |
|---|---|---|---|---|
| 3,569,849 A * | 3/1971 | Cassidy et al. | ................ | 330/255 |
| 3,675,141 A * | 7/1972 | Adams | ................ | 330/263 |
| 4,933,645 A * | 6/1990 | Kasai | ................ | 330/255 |
| 6,046,641 A * | 4/2000 | Chawla et al. | ................ | 330/277 |
| 6,628,221 B2 | 9/2003 | Jin | | |
| 6,750,721 B2 | 6/2004 | Patterson | | |
| 6,775,525 B1 * | 8/2004 | Tanoue et al. | ................ | 455/127.3 |
| 7,834,700 B2 * | 11/2010 | Inamori et al. | ................ | 330/295 |
| 2006/0255880 A1 * | 11/2006 | Suzaki et al. | ................ | 333/104 |
| 2008/0130337 A1 | 6/2008 | Takahashi | | |

FOREIGN PATENT DOCUMENTS

| KR | 2002-0056741 A | 7/2002 |
|---|---|---|
| KR | 10-0436459 | 6/2004 |

* cited by examiner

*Primary Examiner* — Patricia Nguyen
(74) *Attorney, Agent, or Firm* — Rabin & Berdo, P.C.

(57) ABSTRACT

Provided is a power amplifier device. The power amplifier device includes: a cutoff unit cutting off a direct current (DC) component of a signal delivered from a signal input terminal; a circuit protecting unit connected to the cutoff unit and stabilizing a signal delivered from the cutoff unit; and an amplification unit connected to the circuit protecting unit and amplifying a signal delivered from the circuit protecting unit, wherein the amplification unit comprises a plurality of transistors connected in parallel to the circuit protecting unit and the circuit protecting unit comprises resistors connected to between bases of the plurality of transistors.

10 Claims, 4 Drawing Sheets

US 8,130,041 B2

POWER AMPLIFIER DEVICE

CROSS-REFERENCE TO RELATED APPLICATIONS

This U.S. non-provisional patent application claims priority under 35 U.S.C. §119 of Korean Patent Application No. 10-2009-0120101, filed on Dec. 4, 2009, the entire contents of which are hereby incorporated by reference.

BACKGROUND OF THE INVENTION

The present invention disclosed herein relates to a power amplifier device, and more particularly, to a power amplifier device realized with a transistor.

As demands on terminals and communication devices are increased according to recent expansions of communication markets, they need to be small and lightweight. In this case, power consumed in the terminals and communication devices accounts for a vital part of product performance.

A power amplifier device for amplifying power at a transmit output terminal is built in a communication device such as a wire or wireless phone or a mobile phone. This power amplifier device is mainly realized using a transistor. In case of this power amplifier device, a power amplifier circuit with transistors arranged in parallel is typically used to increase an amplification rate.

SUMMARY OF THE INVENTION

The present invention provides a power amplification circuit having a high power gain and stability.

Embodiments of the present invention provide power amplifier devices including: a cutoff unit cutting off a direct current (DC) component of a signal delivered from a signal input terminal; a circuit protecting unit connected to the cutoff unit and stabilizing a signal delivered from the cutoff unit; and an amplification unit connected to the circuit protecting unit and amplifying a signal delivered from the circuit protecting unit, wherein the amplification unit includes a plurality of transistors connected in parallel to the circuit protecting unit and the circuit protecting unit includes resistors connected to between bases of the plurality of transistors.

In some embodiments, when a bias operating point of the plurality of transistors is different, the resistors connected to between the bases of the plurality of transistors may form a negative feedback loop.

In other embodiments, the cutoff unit may include a plurality of capacitors connected in parallel to the signal input terminal.

In still other embodiments, the plurality of capacitors may reduce a reflection coefficient with respect to a signal delivered from the signal input terminal.

In even other embodiments, the circuit protecting unit may further include resistors connected to between each capacitor of the cutoff unit and each transistor of the amplification unit.

In yet other embodiments, the power amplifier devices may further include an amplification adjusting unit connected to the circuit protecting unit and adjusting a voltage level of a bias signal delivered from a bias input terminal.

In further embodiments, the amplification adjusting unit may include a plurality of resistors connected in parallel to the bias input terminal.

In still further embodiments, collectors of the plurality of transistors may be connected to a common matching circuit.

In even further embodiments, the plurality of transistors may be a Heterojunction Bipolar Transistor (HBT).

In yet further embodiments, the plurality of transistors may be a GaAs HBT.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Hereinafter, these embodiments are provided so that this disclosure will be thorough and complete, and will fully convey the scope of the present invention to those skilled in the art.

Figure 1:
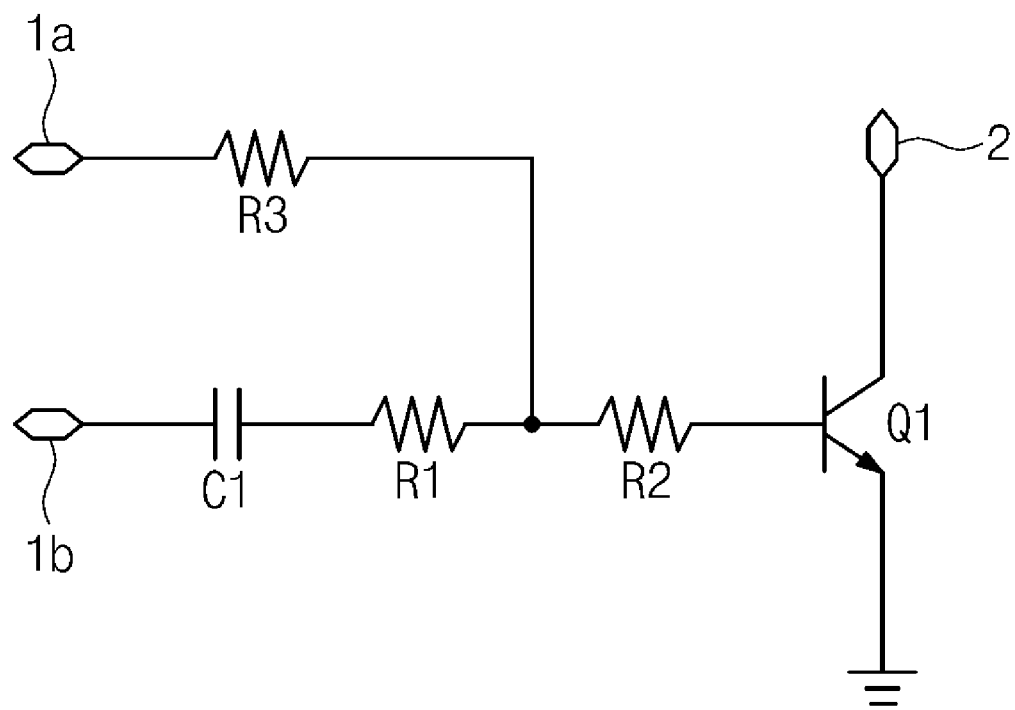
FIG. 1 is a circuit diagram illustrating a unit cell of a power amplifier according to an embodiment of the present invention.

FIG. 1 is a circuit diagram illustrating a unit cell of a power amplifier according to an embodiment of the present invention.

Referring to FIG. 1, the unit cell of the power amplifier includes a capacitor C1, a plurality of resistors R1 to R3, and a transistor Q1. In more detail, a base of the first transistor Q1 is connected in series to the first and second resistors R1 and R2. One end of the third resistor R3 is connected to between the first and second resistors R1 and R2. The first capacitor C1 is connected in series to the first resistor R1.

According to an embodiment of the present invention, the unit cell of the power amplifier receives a DC bias voltage through a bias input terminal 1a. The unit cell of the power amplifier receives an RF signal through a signal input terminal 1b. That is, the unit cell of the power amplifier may be divided into a Direct Current (DC) bias path and a Radio Frequency (RF) signal path.

In the DC bias path, a DC bias voltage is applied to the base of the first transistor Q1 through the second and third resistors R2 and R3. In this case, the sum of the second and third resistors R2 and R3 allows the unit cell of the power amplifier to be electrically stable. That is, when current is increased by the reduction of built-in potential due to a temperature rise, the sum of the second and third resistors R2 and R3 forms a negative feedback that reduces a base-emitter voltage Vv2 of the first transistor Q1. Accordingly, the unit cell of the power amplifier becomes electrically stable.

In the RF signal path, an RF signal is applied to the base of the first transistor Q1 through the first capacitor C1 and the first and second resistors R1 and R2. In this case, the first capacitor C1 serves as to cut off a DC component applied through the signal input terminal 1b. The sum of the first and second resistors R1 and R2 allows the unit cell of the power amplifier to be electrically stable.

As mentioned above, the unit cell of the power amplifier according to an embodiment of the present invention is divided into the DC bias path and the RF signal path. Accordingly, the unit cell of the power amplifier may become electrically stable. Additionally, the third resistor R3 is connected in parallel to between the first and second resistors R1 and R2. Since a value of the third resistor R3 is properly set, a gain of the unit cell of the power amplifier may be adjusted with an appropriate value.

Moreover, according to an embodiment of the present invention, a Bipolar Junction Transistor (BJT) is used as the first transistor Q1. For example, a Heterojunction Bipolar Transistor (HBT) may be used as the first transistor Q1. As another example, a GaAs HBT may be used as the first transistor Q1. However, this should be understood as an exemplary one. For example, the first transistor Q1 may be a Metal-Oxide-Silicon (MOS) transistor.

Furthermore, the power amplifier according to an embodiment of the present invention has a structure in which the unit cells of the amplifier of FIG. 1 is repeatedly connected in parallel. This will be described in more detail with reference to FIG. 2.

Figure 2:
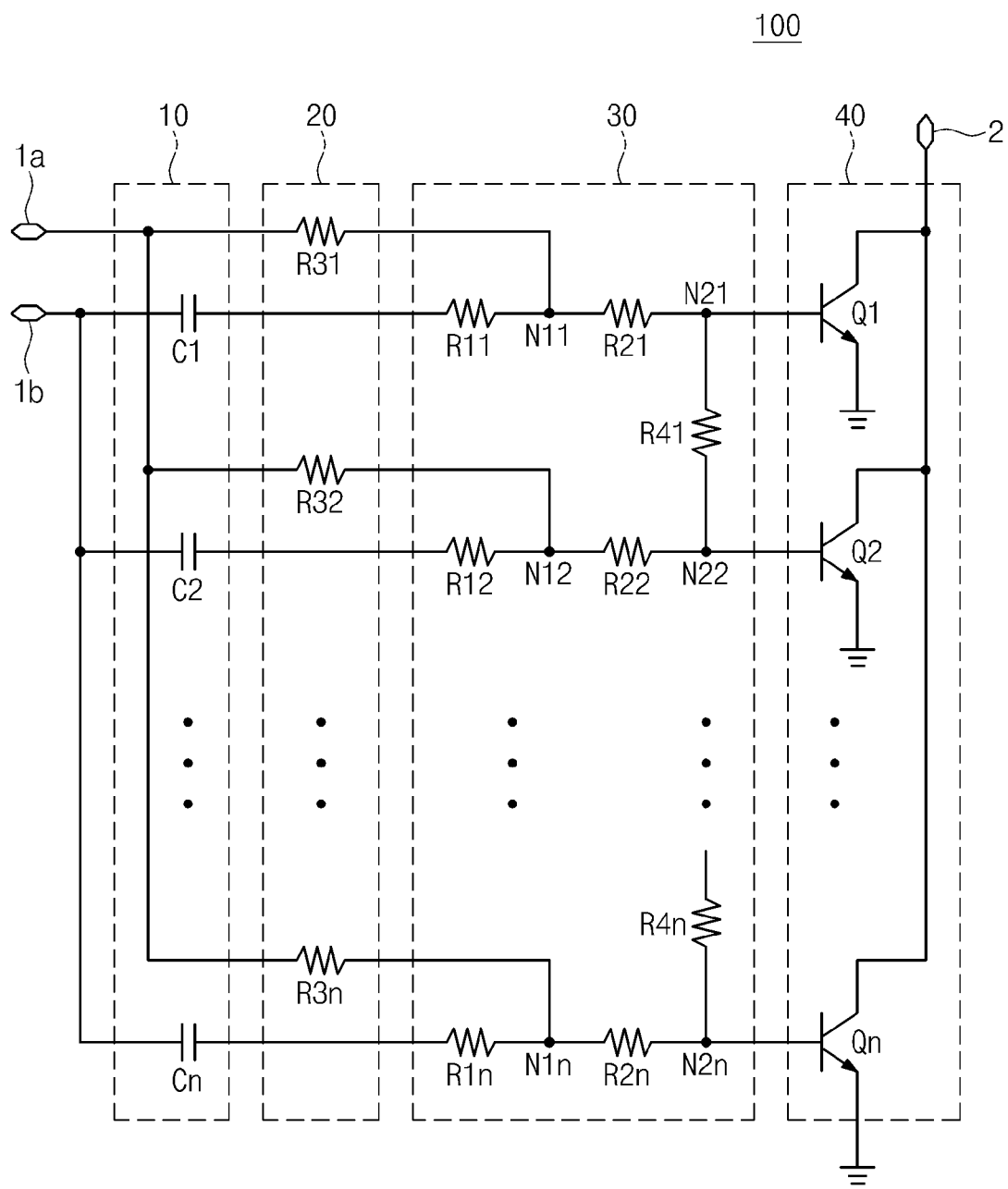
FIG. 2 is a circuit diagram illustrating a power amplifier according to an embodiment of the present invention.

FIG. 2 is a circuit diagram illustrating a power amplifier according to an embodiment of the present invention.

Referring to FIG. 2, the power amplifier 100 includes a cutoff unit 10, an amplification adjusting unit 20, a circuit protecting unit 30, and an amplification unit 40.

The cutoff unit 10 is connected to between a signal input terminal 1b and the amplification adjusting unit 20. The cutoff unit 10 includes a plurality of capacitors C1 to Cn. The cutoff unit 10 serves to cut off a DC component applied from the signal input terminal 1b.

The amplification adjusting unit 20 is connected to between a bias input terminal 1a and the circuit protecting unit 30. The amplification adjusting unit 20 includes a plurality of resistors R31 to R3n. More specifically, one ends of the resistors R31 to R3n of the amplification adjusting unit 20 are connected to the bias input terminal 1a. The other ends of the resistors R31 to R3n of the amplification adjusting unit 20 are connected to between the resistors R11 to R1n and the resistors R21 to R2n of the circuit protecting unit 30. The amplification adjusting unit 20 delivers a DC bias voltage from the bias input terminal 1a to the circuit protecting unit 30.

According to an embodiment of the present invention, the resistors R31 to R3n of the amplification adjusting unit 20 may be set with a proper value to prevent gain reduction and power loss. Accordingly, a DC bias voltage level delivered to the circuit protecting unit 30 may be set with a proper value.

The circuit protecting unit 30 is connected to the cutoff unit 10, the amplification adjusting unit 20, and the amplification unit 40. The circuit protecting unit 30 includes a plurality of resistors R11 to R1n, R21 to R2n, and R41 to R4n.

Specifically, the resistors R11 to R1n and the resistors R11 to R1n of the circuit protecting unit 30 are connected in series to each other. The resistors R11 to R1n of the circuit protecting unit 30 are connected in series to the capacitors C1 to Cn of the cutoff unit 10, respectively. Nodes N11 to N1n between the resistors R11 to R1n and the resistors R21 to R2n of the circuit protecting unit 30 are connected to the resistors R31 to R3n of the amplification adjusting unit 20, respectively. Nodes N21 to N2n between the resistors R21 and R2n and the resistors R41 and R4n of the circuit protecting unit 30 are connected to bases of the transistors Q1 to Qn, respectively.

The circuit protecting unit 30 delivers a signal from the cutoff unit 10 to the amplification unit 40. The resistors R11 to R1n and the resistors R21 to R2n of the circuit protecting unit 30 stabilize a signal from the cutoff unit 10 and output the stabilized signal.

According to an embodiment of the present invention, the resistors R41 to R4n of the circuit protecting unit 30 are respectively connected to between the bases of the transistors Q1 to Qn. For example, the resistor R41 is connected to between a node N21 and a node N22. Accordingly, when a bias operating point of each of the transistors Q1 to Qn is different, the resistors R41 to R4n of the circuit protecting unit 30 stabilize the power amplifier 100 through negative feedback effect.

The amplification unit 40 is connected to the circuit protecting unit 30 and an output terminal 2. The amplification unit 40 amplifies a signal from the circuit protecting unit 30 and then outputs it the output terminal 2.

In more detail, the transistors Q1 to Qn of the amplification unit 40 receive a signal from the signal input terminal 1b through their bases. The transistors Q1 to Qn of the amplification unit 40 receive a bias voltage, delivered from the bias input terminal 1a through their bases, to drive the transistors Q1 to Qn. The transistors Q1 to Qn of the amplification unit 40 amplify the delivered signal and output it to the output terminal 2.

The output terminal 2 is connected to a matching circuit where the power amplifier 100 has the maximum output voltage or gain. The matching circuit typically consists of a combination of an inductor L and a capacitor C.

The power amplifier 100 according to an embodiment of the present invention has the above-mentioned structure. Hereinafter, a series of operations of the power amplifier will be described in more detail.

A signal from the signal input terminal 1b is delivered to the cutoff unit 10. The capacitors C1 to Cn of the cutoff unit 10 cut off a DC component of the delivered signal. Additionally, the capacitors C1 to Cn of the cutoff unit 10 serve to lower a reflection coefficient at the input side.

Signals passing through the cutoff unit 10 are delivered to the circuit protecting unit 30. The resistors R11 to R1n and the resistors R21 to R2n of the circuit protecting unit 30 stabilize the delivered signal. Additionally, resistance values of the resistors R31 to R3n of the amplification adjusting unit 20 are set with a proper value. Accordingly, an input bias of a proper value may be applied to the bases of the transistors Q1 to Qn.

Signals passing through the circuit protecting unit 30 are delivered to the transistors Q1 to Qn of the amplification unit 30. A bias current passing through the amplification adjusting unit 20 is delivered to the transistors Q1 to Qn of the amplification unit 30. The transistors Q1 to Qn of the amplification unit 30 amplify a signal and a bias current and output them.

Moreover, the resistors R41 to R4n of the circuit protecting unit 30 are respectively connected to the bases of the transistors Q1 to Qn. If a bias operating point of each of the transistors Q1 to Qn is different, the resistors R41 to R4n of the circuit protecting unit 30 stabilize the power amplifier 100 through negative feed-back effect.

Figure 3A:
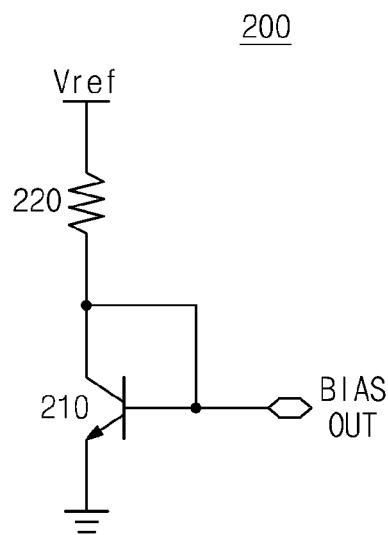
FIG. 3A is a circuit diagram illustrating a bias circuit according to an embodiment of the present invention.

FIG. 3A is a circuit diagram illustrating a bias circuit according to an embodiment of the present invention. A bias output BIAS OUT generated by the bias circuit of FIG. 3A is delivered to the bias input terminal 1a of FIG. 2.

Referring to FIG. 3A, the bias circuit 200 includes a resistor 220 and a transistor 210. A collector of the transistor 210 is connected to the resistor 220 and an emitter of the transistor 210 is connected to a ground. A base of the transistor 210 is connected to the collector. A reference voltage Vref is applied to the transistor 210 through the resistor 220, and the bias output BIAS OUT is outputted through the base of the transistor 210.

Figure 3B:
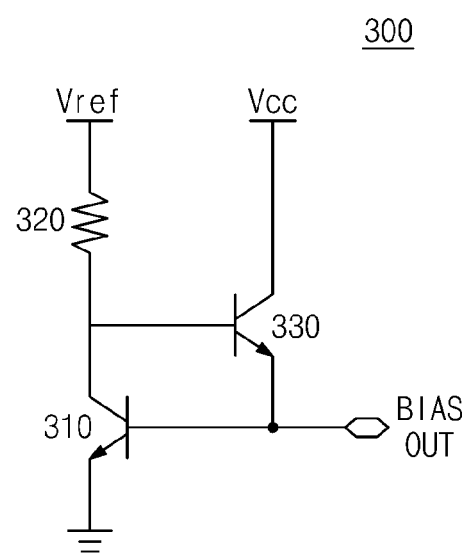
FIG. 3B is a circuit diagram illustrating a bias circuit according to another embodiment of the present invention.

FIG. 3B is a circuit diagram illustrating a bias circuit according to another embodiment of the present invention. The bias circuit 300 of FIG. 3B is similar to that 200 of FIG. 3A. However, the bias circuit 300 of FIG. 3B generates a bias output BIAS OUT through a current mirror.

Figure 4A:
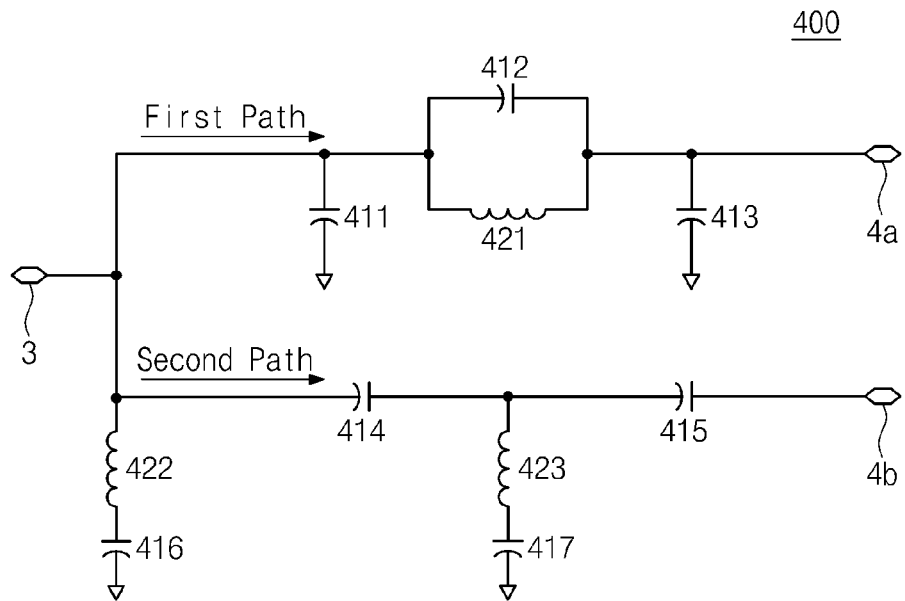
FIG. 4A is a circuit diagram illustrating a matching circuit according to an embodiment of the present invention.

FIG. 4A is a circuit diagram illustrating a matching circuit according to an embodiment of the present invention. An input port 3 of the matching circuit 400 of FIG. 4A receives an RF signal from the output terminal 2 of FIG. 2.

Referring to FIG. 4A, the matching circuit 400 includes the input port 3, output ports 4*a* and 4*b*, a plurality of capacitors 411 to 417, and a plurality of inductors 421 to 423.

In a first path, the capacitor 412 and the inductor 421 constitute a parallel resonant circuit. Values of the capacitor 412 and the inductor 421 may be selectively provided in order to allow the parallel resonant circuit to provide a parallel resonant open circuit on RF signals of a predetermined band. In this case, the RF energy of a predetermined band is not delivered to the output port 4*a*.

In a second path, the inductor 423 and the capacitor 417 form a series resonant circuit for providing a short circuit in a predetermined frequency band. The series resonant circuit provides a high reflection to a frequency of a predetermined band so that an RF energy of a predetermined band is not provided to the output port 4*b*.

Figure 4B:
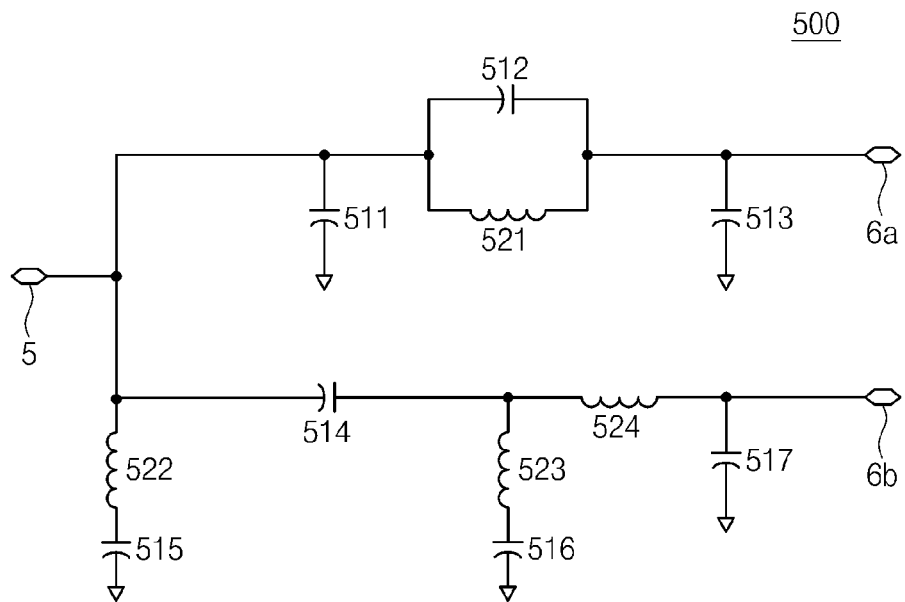
FIG. 4B is a circuit diagram illustrating a matching circuit according to another embodiment of the present invention.

FIG. 4B is a circuit diagram illustrating a matching circuit according to another embodiment of the present invention. The matching circuit 500 of FIG. 4B is similar to that 400 of FIG. 4A. However, the capacitor 415 of FIG. 4A is replaced with the inductor 524 and the capacitor 517 in the matching circuit 500 of FIG. 4B.

According to an embodiment of the present invention, by adding resistors connecting bases of transistors, respectively, a power amplifier circuit having high stability is provided.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A power amplifier device comprising:
   a cutoff unit cutting off a direct current (DC) component of a signal delivered from a signal input terminal;
   a circuit protecting unit connected to the cutoff unit and stabilizing a signal delivered from the cutoff unit; and
   an amplification unit connected to the circuit protecting unit and amplifying a signal delivered from the circuit protecting unit,
   wherein the amplification unit comprises a plurality of transistors connected in parallel to the circuit protecting unit and the circuit protecting unit comprises resistors connected to between bases of the plurality of transistors.

2. The power amplifier device of claim 1, wherein when a bias operating point of the plurality of transistors is different, the resistors connected to between the bases of the plurality of transistors form a negative feedback loop.

3. The power amplifier device of claim 1, wherein the cutoff unit comprises a plurality of capacitors connected in parallel to the signal input terminal.

4. The power amplifier device of claim 3, wherein the plurality of capacitors reduce a reflection coefficient with respect to a signal delivered from the signal input terminal.

5. The power amplifier device of claim 1, wherein the circuit protecting unit further comprises resistors connected to between each capacitor of the cutoff unit and each transistor of the amplification unit.

6. The power amplifier device of claim 1, further comprising an amplification adjusting unit connected to the circuit protecting unit and adjusting a voltage level of a bias signal delivered from a bias input terminal.

7. The power amplifier device of claim 6, wherein the amplification adjusting unit comprises a plurality of resistors connected in parallel to the bias input terminal.

8. The power amplifier device of claim 1, wherein collectors of the plurality of transistors are connected to a common matching circuit.

9. The power amplifier device of claim 1, wherein the plurality of transistors are a Heterojunction Bipolar Transistor (HBT).

10. The power amplifier device of claim 1, wherein the plurality of transistors are a GaAs HBT.

* * * * *